United States Patent
Abbaspour (10) Patent No.: US 11,304,303 B2
(45) Date of Patent: Apr. 12, 2022

(54) METHODS AND PROCESSES FOR FORMING ELECTRICAL CIRCUITRIES ON THREE-DIMENSIONAL GEOMETRIES

(71) Applicant: DUJUD LLC, Atlanta, GA (US)

(72) Inventor: Reza Abbaspour, Marietta, GA (US)

(73) Assignee: DUJUD LLC, Atlanta, GA (US)

( * ) Notice: Subject to any disclaimer, the term of this patent is extended or adjusted under 35 U.S.C. 154(b) by 0 days.

(21) Appl. No.: 17/244,399

(22) Filed: Apr. 29, 2021

(65) Prior Publication Data

US 2021/0345494 A1     Nov. 4, 2021

Related U.S. Application Data

(60) Provisional application No. 63/018,001, filed on Apr. 30, 2020.

(51) Int. Cl.
    *H05K 3/12*     (2006.01)
    *H05K 3/46*     (2006.01)
    (Continued)

(52) U.S. Cl.
    CPC ........... *H05K 3/1258* (2013.01); *H05K 3/043* (2013.01); *H05K 3/1275* (2013.01); *H05K 3/4664* (2013.01); *B33Y 10/00* (2014.12); *B33Y 30/00* (2014.12); *B33Y 80/00* (2014.12); *H05K 3/0011* (2013.01); *H05K 3/0014* (2013.01);
    (Continued)

(58) Field of Classification Search
    CPC .... H05K 3/043; H05K 3/1258; H05K 3/1275; H05K 3/4626; H05K 3/4632; H05K 3/4635; H05K 3/4644; H05K 2203/1338; H05K 2203/135; H05K 2203/1355; H05K 3/143; H05K 3/284; H05K 3/4664; H05K 3/4652; H05K 3/467; H05K 2203/0574; H05K 2203/0588; H05K 2203/1184;
    (Continued)

(56) References Cited

U.S. PATENT DOCUMENTS 4,218,532 A * 8/1980 Dunkleberger ........ H05K 3/143
    216/40
4,497,684 A * 2/1985 Sebesta
    (Continued)

FOREIGN PATENT DOCUMENTS

| JP | 2013061457 A * | 4/2013 |
| WO | 2007095439 A2 | 8/2007 |
| WO | 2019241286 A1 | 12/2019 |

OTHER PUBLICATIONS

European Search Report and Written Opinion dated Jul. 20, 2021 issued in PCT Application No. PCT/US2021/029915.

*Primary Examiner* — A. Dexter Tugbang
(74) *Attorney, Agent, or Firm* — Troutman Pepper Hamilton Sanders LLP; Mark Lehi Jones (57) ABSTRACT

Methods for forming electrical circuitries on three-dimensional (3D) structures and devices made using the methods. A method includes forming selectively shaped 3D structures using additive manufacturing. The method includes forming undercuts on upper-level pedestals of the 3D structures that effectively act as overhanging deposition masks for selectively preventing deposition of a selected material on a corresponding portions of lower levels. The method includes simultaneously forming and electrically isolating materials directionally deposited on the 3D structure.

16 Claims, 5 Drawing Sheets

(51) Int. Cl.
*H05K 3/04* (2006.01)
*B33Y 80/00* (2015.01)
*B33Y 30/00* (2015.01)
*H05K 3/14* (2006.01)
*B33Y 10/00* (2015.01)
*H05K 3/00* (2006.01)
*H05K 3/28* (2006.01)

(52) U.S. Cl.
CPC ............ *H05K 3/143* (2013.01); *H05K 3/284* (2013.01); *H05K 3/467* (2013.01); *H05K 3/4626* (2013.01); *H05K 3/4632* (2013.01); *H05K 3/4635* (2013.01); *H05K 3/4644* (2013.01); *H05K 3/4652* (2013.01); *H05K 2203/0574* (2013.01); *H05K 2203/0588* (2013.01); *H05K 2203/1184* (2013.01); *H05K 2203/135* (2013.01); *H05K 2203/1338* (2013.01); *H05K 2203/1355* (2013.01)

(58) Field of Classification Search
CPC .... H05K 3/0011; H05K 3/0014; B33Y 80/00; B33Y 30/00; B33Y 10/10; B33Y 10/00
See application file for complete search history.

(56) References Cited

U.S. PATENT DOCUMENTS

| | | | | |
|---|---|---|---|---|
| 4,606,998 | A * | 8/1986 | Clodgo | H05K 3/143 257/E21.024 |
| 4,770,897 | A * | 9/1988 | Wu | H05K 3/143 438/628 |
| 4,770,921 | A * | 9/1988 | Wacker | H05K 3/4644 174/250 |
| 5,863,447 | A * | 1/1999 | Coteus | H05K 2203/135 216/17 |
| 7,960,097 | B2 | 6/2011 | Chau et al. | |
| 10,254,499 | B1 | 4/2019 | Cohen et al. | |
| 2004/0256731 | A1* | 12/2004 | Mao | H05K 3/4626 257/773 |
| 2006/0040567 | A1* | 2/2006 | Bernier | H05K 3/284 439/738 |
| 2007/0191540 | A1* | 8/2007 | Nunoshige | H05K 3/4626 524/611 |
| 2009/0029065 | A1* | 1/2009 | Terada | H05K 3/0014 427/553 |
| 2009/0185357 | A1* | 7/2009 | Rendek, Jr. | H05K 3/4626 361/762 |
| 2016/0249463 | A1* | 8/2016 | Yoshida | H05K 3/4652 |
| 2020/0045832 | A1 | 2/2020 | Hikmet et al. | |

* cited by examiner

METHODS AND PROCESSES FOR FORMING ELECTRICAL CIRCUITRIES ON THREE-DIMENSIONAL GEOMETRIES

CROSS-REFERENCE TO RELATED APPLICATION

This application claims priority to U.S. Provisional Patent Application Ser. No. 63/018,001, filed on 30 Apr. 2020, entitled: "Methods and Processes for Forming Electrical Circuitries on Dielectric Three-Dimensional Geometries," the contents of which are hereby incorporated by reference in their entirety as if presented herein in full.

FIELD

This disclosure generally relates to methods for forming three-dimensional (3D) structures with undercuts and forming electrical circuitries on such structures. The disclosed technology includes a process for forming isolated regions (traces, etc.) of selected material by directional deposition of the selected material on the 3D structures. The undercuts formed in the 3D structure effectively create overhang deposition mask regions that prevent the selected material from being deposited on regions below the undercuts.

BACKGROUND

Traditional methods of manufacturing circuit boards for use in various electronic circuits typically utilize conductive traces and pads etched from one or more sheets of copper and laminated onto and/or between non-conductive glass-epoxy or other flat substrates. External components (such as integrated circuits, resistors, capacitors, inductors, etc.,) are then electrically and mechanically fastened to the circuit board using solder.

A standard method for producing the desired layout pattern for the conductive traces (and non-conductive regions therebetween) involves a process similar to photograph development where a conductive surface (such as copper) is coated with a photoresist and exposed with light having the desired pattern that is projected onto the surface, which selectively cures the photoresist in regions where the light impinges. Typically, the photoresist is a monomer that becomes polymerized by the light. The conductive material underneath the light-cured regions of the resist material is protected from dissolution into an etching solution. While this conventional approach of manufacturing can be suitable for mass-production of certain electronic circuits, such circuits are limited to planar geometries with limited feature resolution, can be costly due to the multiple processing steps involved, and can pose a negative environmental impact if the etchants and other chemicals involved are not properly disposed.

As electronic components become smaller and more complex, new fabrication techniques will be needed to address shortcomings with conventional 2D micro-fabrication techniques. Recent advancements in MEMS manufacturing have enabled the production of advanced miniature devices, such as multi-axis gyroscopes, microwave circuits, waveguides, etc. However, the ability to produce such devices in three-dimension (3D) at a reasonable cost remains a challenge. Producing custom 3D parts with dimensional accuracy and precision using a 2D manufacturing process and non-uniform materials is still costly and difficult to achieve if not impossible.

Accordingly, there is a need for improved systems and methods that can overcome the current shape limitations and process complexities associated with traditional planar electronic circuit manufacturing. Embodiments of the present disclosure are directed to this and other considerations.

BRIEF SUMMARY

The disclosed technology includes methods for forming electrical circuitries on three-dimensional (3D) structures, and devices made using such methods.

According to an exemplary implementation of the disclosed technology, a method is provided for additively manufacturing an electronic device structure. The method includes forming a 3D structure characterized by an upper level, a lower level, and a pedestal portion joining the upper level and the lower level. The pedestal portion is formed with an undercut that defines an upper level overhang configured to define a mask region on a corresponding portion of the lower level to prevent deposition of a selected material on the corresponding portions of the lower level that are masked by the upper level overhang.

Consistent with the disclosed embodiments, a three-dimensional (3D) electronic circuit is disclosed that may be fabricated using methods described herein. The 3D electronic circuit can include electrically conductive traces formed by deposition of a selected material on a 3D structure that is formed by an additive manufacturing process (such as multilevel polymer photocuring). The 3D structure can include an upper level, a lower level, and a pedestal portion joining the upper level and the lower level. An undercut is selectively formed in the pedestal portions. The undercut defines an upper level overhang that is configured to define a mask region on a corresponding portion of the lower level to prevent deposition of the selected material on the corresponding portions of the lower level that are masked by the upper level overhang. The electrically conductive traces are selectively isolated from one another by one or more of the mask region and the undercut, and the undercut is configured to selectively define the mask region directly below the upper level overhang to prevent deposition of the selected material on the corresponding portion of the lower level while allowing deposition of the selected material on upper level regions and on lower level regions that are not masked by the upper level overhang.

Further features of the disclosed design and the advantages offered thereby are explained in greater detail hereinafter regarding specific embodiments illustrated in the accompanying drawings, wherein like elements are indicated be like reference designators.

BRIEF DESCRIPTION OF THE DRAWINGS

Reference will now be made to the accompanying drawings, which are not necessarily drawn to scale, and which illustrate various implementations and aspects of the disclosed technology and, together with the description, serve to explain the principles of the disclosed technology.

DETAILED DESCRIPTION

The disclosed technology includes methods for forming selectively shaped 3D structures using additive manufacturing. Certain processes are disclosed herein for forming isolated regions (traces, etc.) of selected material by directional deposition of the selected material on the 3D structures. In certain implementations, undercuts formed in the 3D structure effectively create overhang deposition masking regions that prevent the selected material from being deposited on regions below the undercuts. The disclosed technology enables simultaneous formation and electrical isolation of regions in which materials are directionally deposited on the 3D structure using various deposition techniques.

Although preferred embodiments of the disclosed technology are explained in detail, it is to be understood that other embodiments are contemplated. Accordingly, it is not intended that the disclosed technology is limited in its scope to the details of construction and arrangement of components set forth in the following description or illustrated in the drawings. The disclosed technology is capable of other embodiments and of being practiced or carried out in various ways. As used in the specification and the appended claims, the singular forms "a," "an," and "the" include plural referents unless the context clearly dictates otherwise.

It is intended that each term presented herein contemplates its broadest meaning as understood by those skilled in the art and may include all technical equivalents, which operate in a similar manner to accomplish a similar purpose.

Ranges may be expressed herein as from "about" or "approximately" one particular value and/or to "about" or "approximately" another particular value. When such a range is expressed, another embodiment may include from the one particular value and/or to the other particular value. Similarly, values may be expressed herein as "about" or "approximately."

The terms "comprising" or "containing" or "including" means that at least the named element, material, or method step is present in the apparatus or method, but does not exclude the presence of other elements, materials, and/or method steps, even if the other elements, materials, and/or method steps have the same function as what is named.

The term "exemplary" as used herein is intended to mean "example" rather than "best" or "optimum."

Referring now to the figures, exemplary embodiments of the disclosed technology are herein described. It is to be understood that the figures and descriptions of the disclosed technology have been simplified to illustrate elements that are relevant for a clear understanding, while eliminating, for purposes of clarity, other elements found in typical electronics circuits and associated devices. Those of ordinary skill in the art will recognize that other elements may be desirable and/or may be required in order to implement the disclosed technology. However, because such elements are well known in the art, and because they may not facilitate a better understanding, a discussion of such elements is not provided herein.

Figure 1:
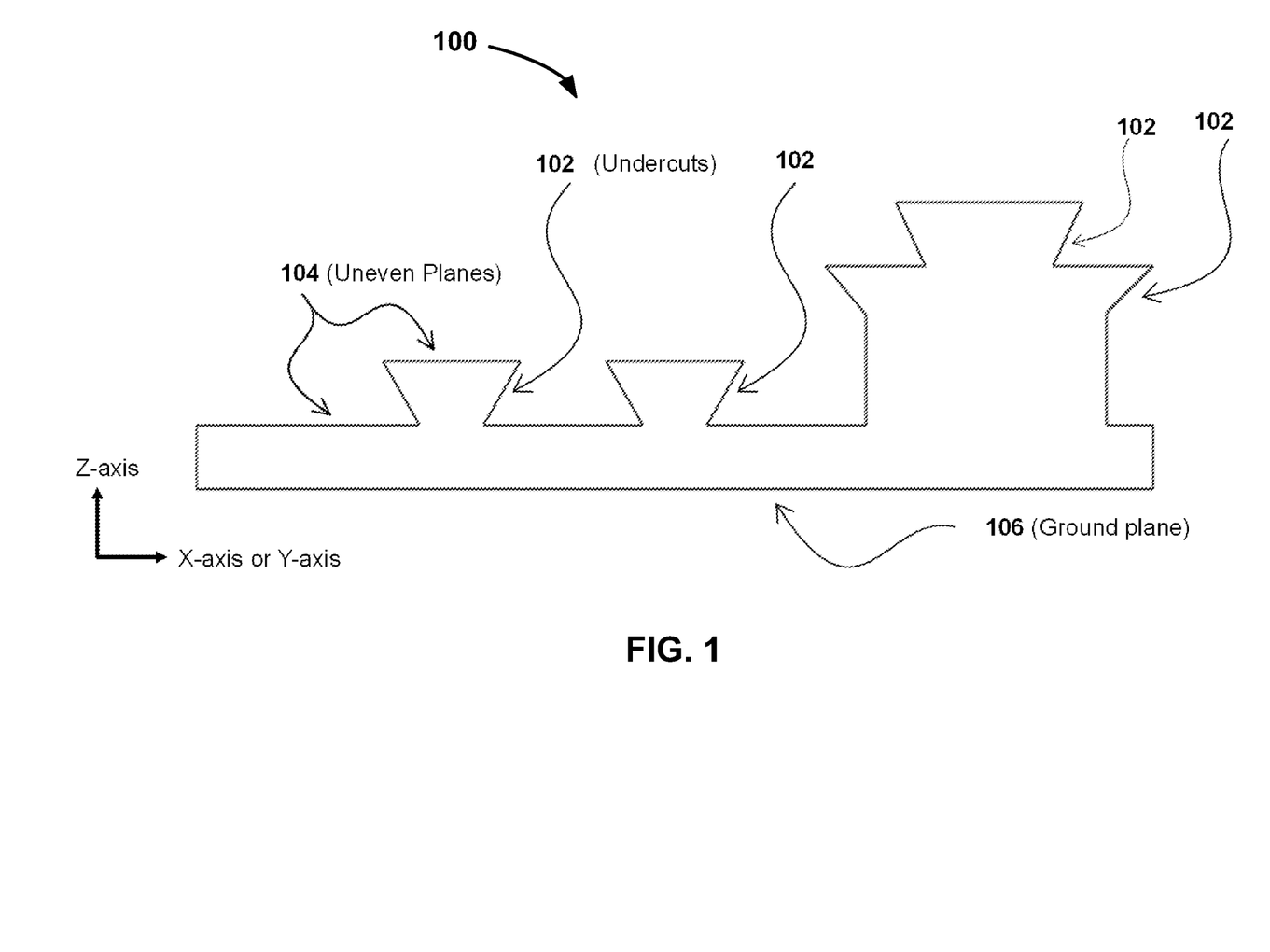
FIG. 1 is a cross-sectional side-view illustration of a three-dimensional (3D) structure 100 having multiple levels and undercuts formed by additive manufacturing, according to certain exemplary embodiments of the disclosed technology.

FIG. 1 depicts a cross-sectional side-view illustration of a three-dimensional (3D) structure 100 having undercuts 102 and uneven planes 104 according to certain exemplary embodiments of the disclosed technology. In this example embodiment, four separate (top-facing) planes and a (bottom-facing) ground plane 106 are depicted.

In accordance with certain exemplary implementations of the disclosed technology, the 3D structure 100 may be formed by various additive manufacturing processes, including but not limited to Fused Deposition Modeling (FDM), Binder Jetting Printing (BJP), Digital Light Projection (DLP), Continuous Digital Light Projection (CDLP), Continuous Liquid Interface Production (CLIP), Two Photon Printing (2PP), and or classic Stereolithography (SLA).

In one exemplary implementation of the disclosed technology, a DLP 3D printer may be utilized in at top-down additive process in which the curing device (light projector) is located underneath a translucent resin bath. When starting a print, a build platform is submerged at the bottom of the bath and moves up incrementally during the printing process. The size of the increment determines the thickness of each layer. The first layer of the printed object is solidified using the light from the projector, which causes it to stick to the build platform. The platform rises and the whole process repeats iteratively, creating a solid object as a result. In other exemplary implementations, the process may utilize a bottom-up additive process.

In accordance with certain exemplary implementations of the disclosed technology, one or more commercial photodefinable resins/polymers may be utilized in the additive process to create the 3D structure 100, including but not limited to SLA and DLP photopolymers, diacrylate based liquid photopolymers (such as IP-S, and/or IP-DIP), SU8 photopolymer, acrylate based photopolymers (such as PROTO-GRAY), etc.

According to certain exemplary embodiments, forming the 3D structure 100 can include utilizing one or more of photodefinable polymeric material photocuring, photodefinable non-polymeric material photocuring, and mixture of photodefinable polymeric material and non-polymeric material.

According to certain exemplary embodiment, the additive manufacturing process may utilize the above-mentioned (and/or other) 3D printing techniques to provide layer thickness and/or features over a wide range of different scales. The nano-scale process using 2PP, for example, may produce layer thickness and/or minimum feature sizes ranging in dimensions from about 50 nm to about 800 nm. The high resolution micron-scale process using DLP, for example, may produce layer thickness and/or minimum feature sizes ranging in dimensions from about 0.9 µm to about 20 µm. The low resolution micron-scale process using SLA or BJP, for example, may produce layer thickness and/or minimum feature sizes ranging in dimensions from about 20 µm to about 50 µm. The macro scale process using FDM, for example, may produce layer thickness and/or minimum feature sizes ranging in dimensions from about 50 µm to about 200 µm. Thus, a wide range of additive 3D printing capabilities may be employed to produce the 3D structures described herein, ranging from tens of nm scale to tens of mm scale.

Certain exemplary implementations of the disclosed technology may include depositing a selected material with a layer thickness at different scales.

A nano-scale process, for example, may utilize physical and/or chemical vapor deposition to produce a layer thickness ranging from about 1 nm to about 300 nm.

A high resolution micron-scale process, for example may utilize physical and/or chemical vapor deposition to produce a layer thickness ranging from about 200 nm to about 1 µm.

A low resolution micron-scale process, for example, may utilize directional sputtering to produce a layer thickness ranging from about 200 nm to about 1 µm.

A macro scale process, using spray coating, for example, may produce a layer thickness ranging from about 2 µm to about 10 µm.

Figure 2:
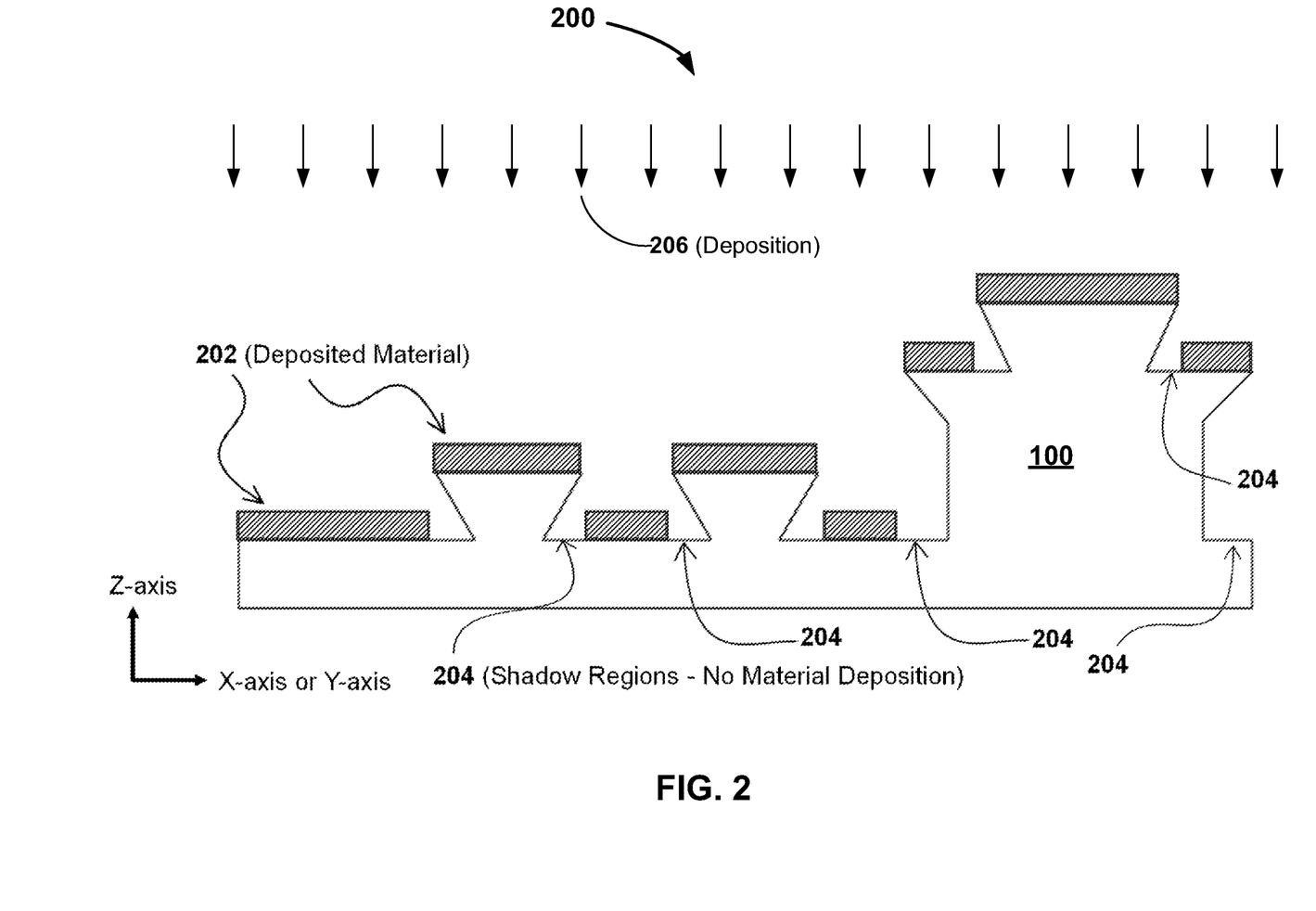
FIG. 2 illustrates a deposition process 200 in which a selected material is directionally deposited on a 3D structure (for example, the 3D structure 100 as shown in FIG. 1) using various physical and chemical deposition techniques. Certain embodiments of the process 200 may be utilized to simultaneously create regions of deposited material separated by regions having no material deposition.

FIG. 2 illustrates an exemplary deposition process 200 that may be utilized to deposit a selected material on a printed 3D structure 100 (as discussed above with referenced to FIG. 1) to simultaneously form multiple regions of deposited material 202 that may be isolated (electrically, thermally, mechanically, etc.,) from one another by shadow regions 204 in which no material is deposited due to the material deposition 206 being blocked by the undercuts (such as undercuts 102 shown in FIG. 1). According to an exemplary embodiment, the selected material may be directionally deposited 206 on the 3D structure 100 using various deposition techniques, including, but not limited to deposition processes such as sputtering, thermal evaporation, electroless-plating, electro-plating, chemical vapor deposition, spray coating, and aerosol jet printing. In accordance with certain exemplary implementations of the disclosed technology, an angle of deposition 206 may be selected to range from about 0 degrees to about 90 degrees with respect to a top surface of the 3D structure 100.

As depicted in FIG. 2, the selected material may be deposited 202 on at least the upper level(s) and non-masked portions of the lower level(s) where the non-masked portions of the lower level(s) are not masked or blocked by the undercuts 102 and/or the resulting associated overhang(s) of the upper level(s).

In accordance with certain exemplary implementations of the disclosed technology, the selected material for deposition 206 can include one or more of an adhesion material, an electrically conductive material, a semiconductor material, an electrical insulator material, a thermally conductive material, and a thermally non-conductive material. In accordance with certain exemplary implementations of the disclosed technology, the selected material for deposition 206 can include metal(s) and/or metal alloy(s). In certain exemplary implementations, the material selected for deposition 206 may include, without limitation, titanium, tin alloys, Gallium alloys, copper, silver, gold silicon-oxides, and nitrides. In certain exemplary implementations, titanium may be deposited and act as an adhesion material to enhance adhesion of additional layers of other selected materials deposited on top of the titanium. In certain exemplary implementations, gold may be utilized to form a top layer to reduce oxidation.

In certain exemplary implementations, the selected material for deposition 206 can include dielectric materials, including but not limited to any oxide(s), such as $Cu_xO_y$, $Al_xO_y$, $Si_xO_y$, graphite-oxide, etc.

In certain exemplary implementations, the selected material for deposition 206 can include any nitride(s), such as $Ti_xN_y$, $Si_xN_y$, etc.

In certain exemplary implementations, the selected material for deposition 206 can include any non-photopolymer(s), such as PLA and ABS In certain exemplary implementations, the selected material for deposition 206 can include any of the above mentioned photopolymers.

In certain exemplary implementations, the selected material for deposition 206 can include any non-ferro metal(s), such as Al, Ti, Cu, Pb, etc.

In certain exemplary implementations, the selected material for deposition 206 can include any ferro metal(s), such as Fe, Ni, etc.

In certain exemplary implementations, the selected material for deposition 206 can include any noble metal(s), such as Au, Ag, Pt, etc.

In certain exemplary implementations, the selected material for deposition 206 can include any carbon based material(s), such as graphite, graphene, etc.

In certain implementations, the process 200 may include depositing an electrically conductive material on at least the upper level(s) and non-masked portions of the lower level(s) to form at least two electrically conductive traces that are electrically isolated from one another by at least the masked (or shadow 204) portions of the lower level.

In accordance with certain exemplary implementations of the disclosed technology, the deposited material(s) 202 may undergo thermal and/or mechanical treatment, which may include annealing, compression, ultrasonic welding, etc. For example, in the case where the deposited material 202 forms electrically conductive traces, the traces may be annealed, thermally treated, mechanically treated, etc., to enhance thermal and mechanical properties and/or to enhance binding with one or more of external metal wires, C4 microbumps of a chip, pins, and metal leads.

In certain implementations, a thickness of the deposited material 202 may be reduced by one or more of vapor etching, chemical etching, chemical-mechanical-polishing, and reactive-ion-etching.

According to an exemplary implementation of the disclosed technology, the selected material may be deposited on one or more of a top surface, a bottom surface, a slope, a flat surface, and a curvature of the 3D structure 100.

In accordance with certain exemplary implementations of the disclosed technology, various undercut geometries 300 may be produced in the 3D structure (such as the 3D structure 100 as shown and discussed above with reference to FIG. 1 and/or FIG. 1). Certain exemplary undercut geometries 300 will now be discusses with reference to FIGS. 3A, 3B, 3C, and 3D, however additional undercut geometries not shown are within the scope of the disclosed technology.

Figure 3A:
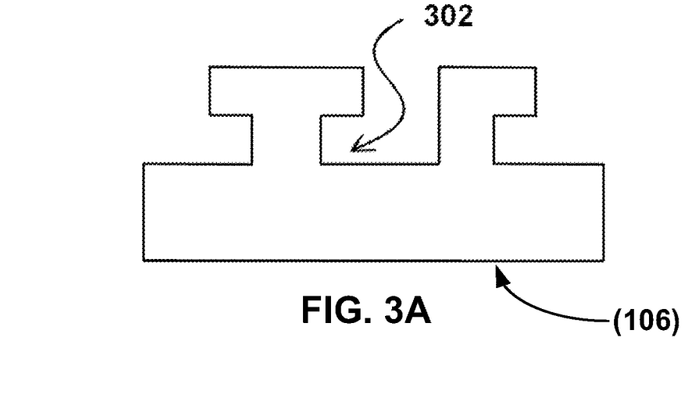
FIG. 3A depicts a cross-sectional side-view illustration of a 3D structure formed and characterized by 90 degree corners, resulting in rectangularly-shaped undercuts 302, in accordance with certain exemplary implementations of the disclosed technology.

FIG. 3A depicts a cross-sectional side-view illustration of a 3D structure formed and characterized by 90 degree corners, resulting in rectangularly-shaped undercuts 302, in accordance with certain exemplary implementations of the disclosed technology.

Figure 3B:
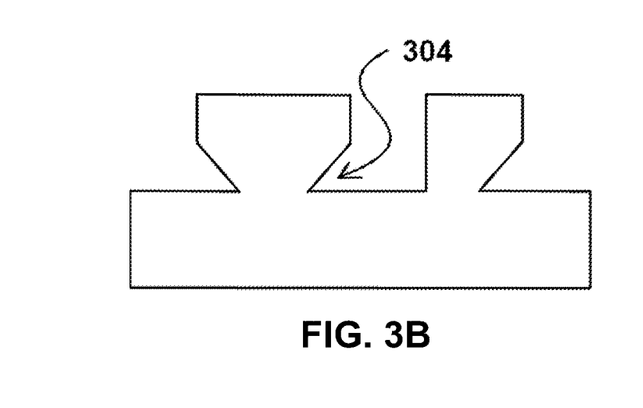
FIG. 3B depicts a cross-sectional side-view illustration of a 3D structure formed and characterized by triangular-shaped undercuts 304, in accordance with certain exemplary implementations of the disclosed technology.

FIG. 3B depicts a cross-sectional side-view illustration of a 3D structure formed and characterized by triangular-shaped undercuts 304, in accordance with certain exemplary implementations of the disclosed technology.

Figure 3C:
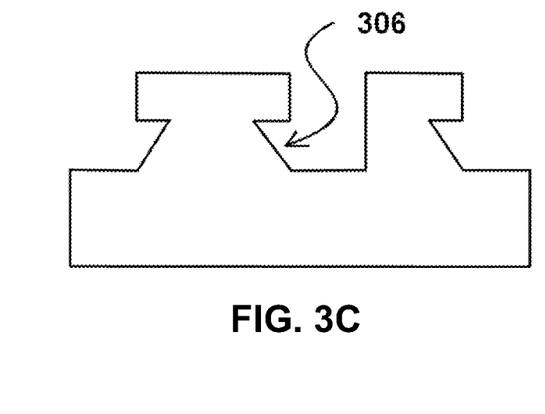
FIG. 3C depicts a cross-sectional side-view illustration of a 3D structure formed and characterized by sloped undercuts 306, in accordance with certain exemplary implementations of the disclosed technology.

FIG. 3C depicts a cross-sectional side-view illustration of a 3D structure formed and characterized by sloped undercuts 306, in accordance with certain exemplary implementations of the disclosed technology.

Figure 3D:
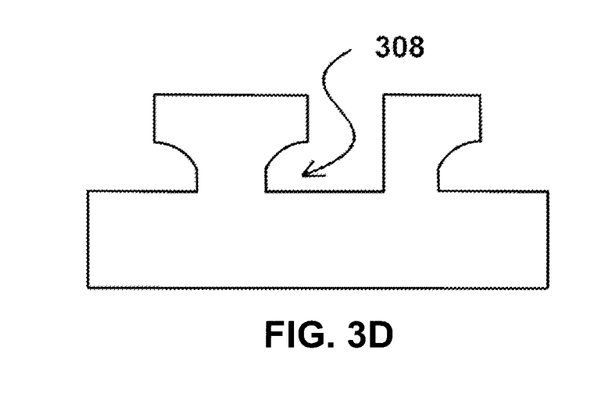
FIG. 3D depicts a cross-sectional side-view illustration of a 3D structure formed and characterized by curve-shaped undercuts 308, in accordance with certain exemplary implementations of the disclosed technology.

FIG. 3D depicts a cross-sectional side-view illustration of a 3D structure formed and characterized by curve-shaped undercuts 308, in accordance with certain exemplary implementations of the disclosed technology.

Figure 4:
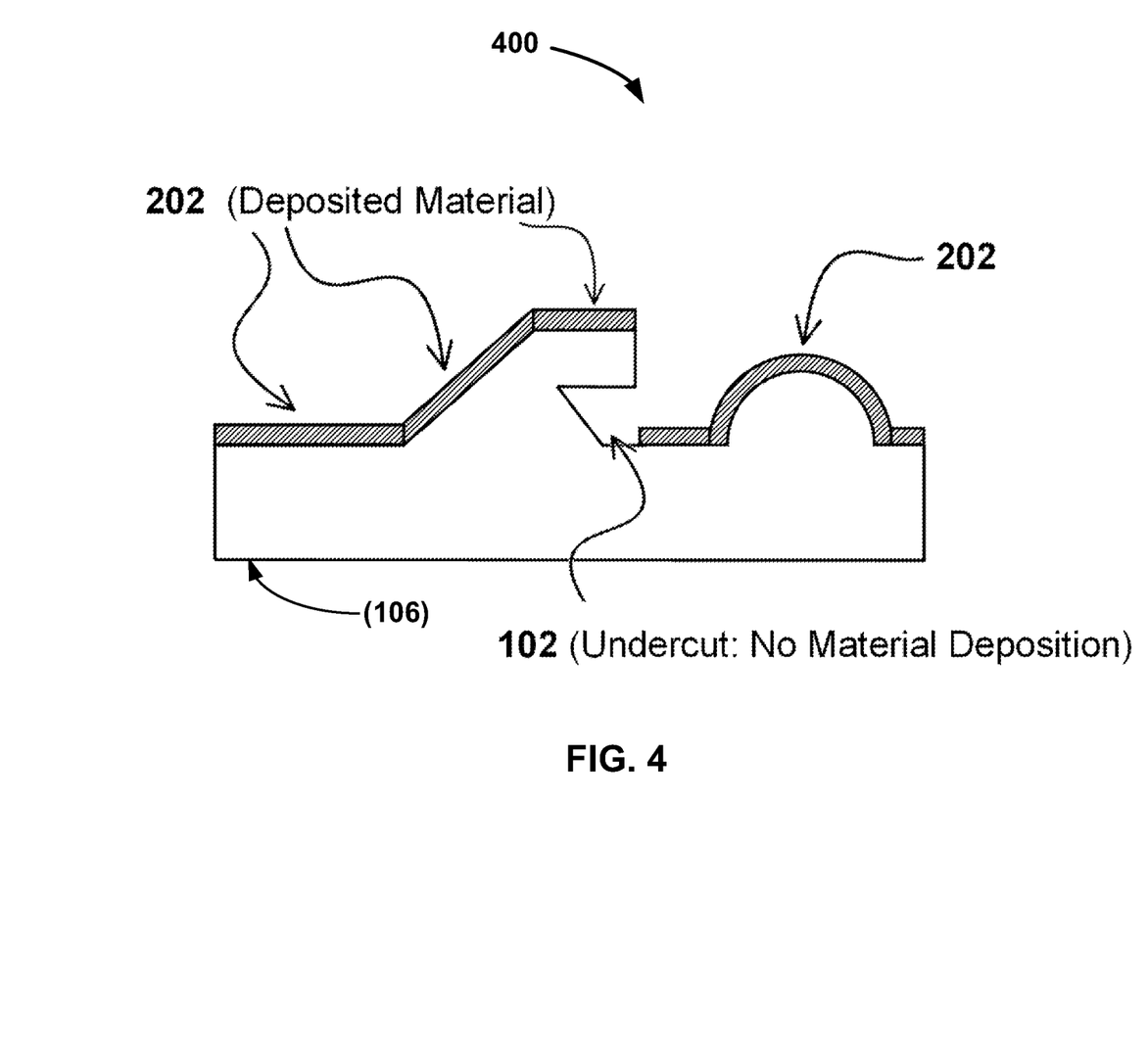
FIG. 4 depicts a cross-sectional side-view illustration of selected material deposited on surfaces of a 3D structure 400 having flat, sloped, and curved portions, in accordance with certain exemplary implementations of the disclosed technology.

FIG. 4 depicts a cross-sectional side-view illustration of selected material deposited on surfaces of a 3D structure 400 having flat, sloped, and curved portions, in accordance with certain exemplary implementations of the disclosed technology.

In accordance with certain exemplary implementations of the disclosed technology, the undercut geometries may be characterized by one or more of sloped steps, reverse curvatures, 90° angle steps, and combination of sloped steps and a 90° angle step.

FIG. 4 depicts a cross-sectional side-view illustration of selected material deposited on surfaces of a 3D structure 400 having flat, sloped, and curved portions, in accordance with certain exemplary implementations of the disclosed technology.

In accordance with certain exemplary implementations of the disclosed technology, the 3D structure 400 may be configured to be compressible to create a spring force. The undercut 102, for example, as shown in FIG. 4, may be utilized to define and produce an overhang region than may be compressible.

Figure 5:
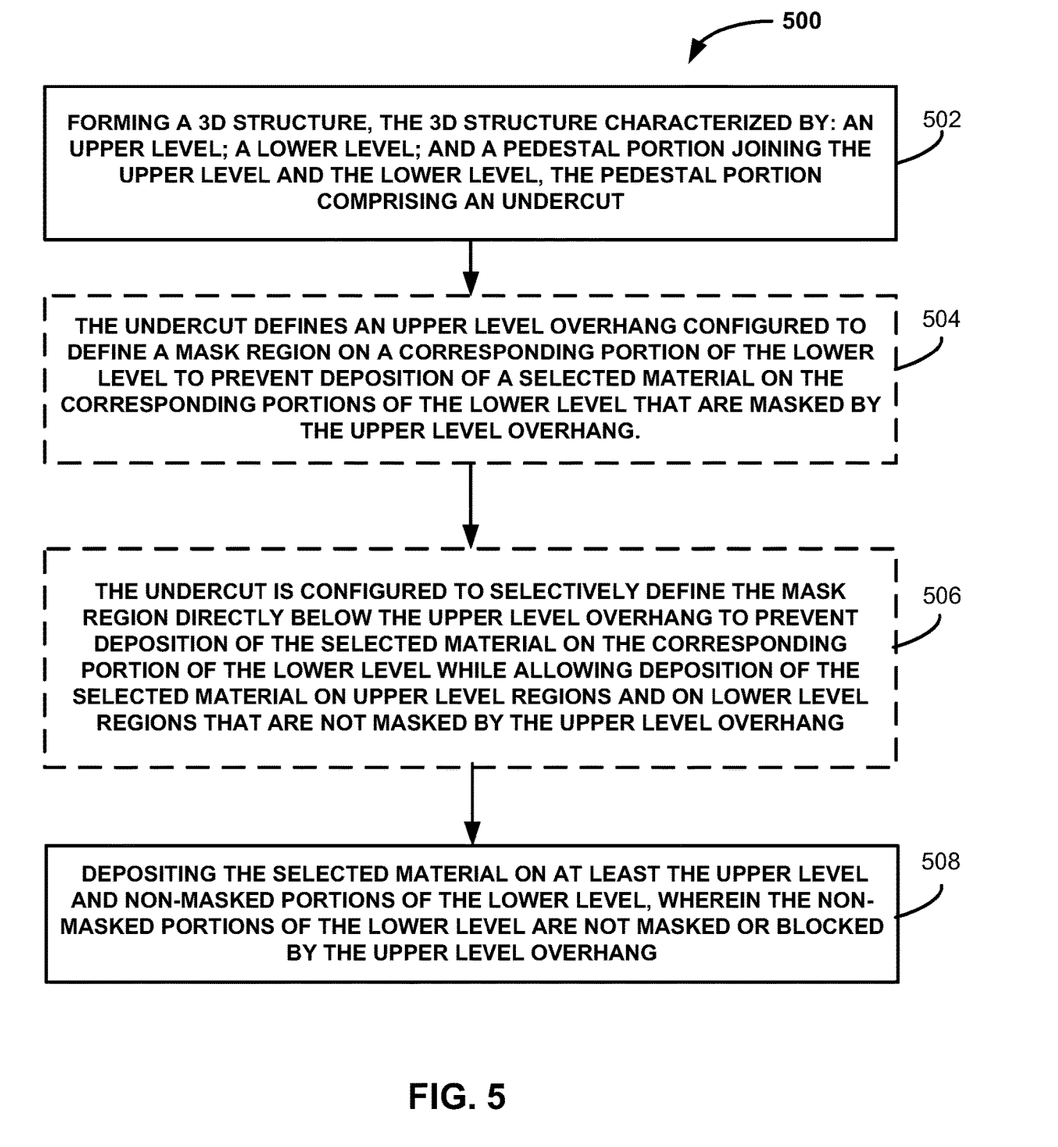
FIG. 5 is a flow diagram of a method 500, according to an exemplary implementation of the disclosed technology.

FIG. 5 is a flow diagram of a method 500 for additively manufacturing an electronic device structure, according to an exemplary implementation of the disclosed technology. In block 502, the method 500 includes forming a 3D structure, the 3D structure characterized by an upper level; a lower level; and a pedestal portion joining the upper level and the lower level, the pedestal portion comprising an undercut.

In descriptive block 504, the undercut defines an upper level overhang configured to define a mask region on a corresponding portion of the lower level to prevent deposition of a selected material on the corresponding portions of the lower level that are masked by the upper level overhang.

In descriptive block 506, the undercut is configured to selectively define the mask region directly below the upper level overhang to prevent deposition of the selected material on the corresponding portion of the lower level while allowing deposition of the selected material on upper level regions and on lower level regions that are not masked by the upper level overhang.

In block 508, the method 500 includes depositing the selected material on at least the upper level and non-masked portions of the lower level, wherein the non-masked portions of the lower level are not masked or blocked by the upper level overhang.

In accordance with certain exemplary implementations of the disclosed technology, depositing the selected material can include one or more of sputtering, thermal evaporation, electroless-plating, electro-plating, chemical vapor deposition, spray coating, and aerosol jet printing. In certain implementations, the angle of deposition may be selected from a range of 0 degrees to 90 degrees with respect to a top surface of the 3D structure.

In certain exemplary implementations, the selected material can include one or more of an adhesion material, an electrically conductive material, a semiconductor material, an electrical insulator material, a thermally conductive material, and a thermally non-conductive material.

In certain implementations, the selected material can include one or more of metal and metal alloys.

Certain exemplary implementations of the disclosed technology can include reducing a thickness of the deposited selected material by one or more of vapor etching, chemical etching, chemical-mechanical-polishing, and reactive-ion-etching. In certain implementations where stray material has formed in unwanted regions (due to deposition overspray, processing errors, etc., for example), the above-referenced techniques may be utilized to remove thin layers of the stray material while only slightly reducing the thickness of the material in regions where it was intended to be deposited.

An upper level and the lower level of the 3D structure manufactured using methods discussed herein may be characterized by one of more of a planar surface, a slope, and a curvature.

In accordance with certain exemplary implementations of the disclosed technology, forming the 3D structure can include utilizing one or more of photodefinable polymeric material photocuring, photodefinable non-polymeric material photocuring, and mixture of photodefinable polymeric material and non-polymeric material.

According to certain exemplary implementations, the undercut discussed and shown herein may be characterized by one or more of sloped steps, reverse curvatures, 90° angle steps, and combination of sloped steps and a 90° angle step.

In certain exemplary implementations, the selected material may be deposited on one or more of a top surface, a bottom surface, a slope, a flat surface, and a curvature of the 3D structure.

In accordance with certain exemplary implementations of the disclosed technology, the 3D structure and the undercuts discussed herein may be configured to be compressible to create a spring force.

Certain exemplary implementations may include depositing an electrically conductive material on at least the upper level and non-masked portions of the lower level to form at least two electrically conductive traces that are electrically isolated from one another by at least the masked portions of the lower level.

Certain exemplary implementations may include one or more of annealing, thermally treating, and mechanically treating at least one of the electrically conductive traces to enhance thermal and mechanical properties and to enhance binding with one or more of external metal wires, C4 micro-bumps of a chip, pins, and metal leads. In certain implementations, any deposited material (conductive or otherwise) may be treated to enhance durability, adhesion, etc.

Certain exemplary implementations may include forming or stacking a 3D superstrate structure on one or more of a top, a bottom, and a side of the 3D structure using one or more of additive manufacturing, 3D printing, and heterogenous assembly. In accordance with certain exemplary implementations of the disclosed technology, the 3D superstrate structure and the 3D structure may be electrically connected.

In accordance with certain exemplary implementations of the disclosed technology, a three-dimensional (3D) electronic circuit may be fabricated using methods described herein. The 3D electronic circuit can include electrically conductive traces formed by deposition of a selected material on a 3D structure that is formed by an additive manufacturing process (such as multilevel polymer photocuring). The 3D structure can include an upper level, a lower level, and a pedestal portion joining the upper level and the lower level. An undercut is selectively formed in the pedestal portions. The undercut defines an upper level overhang that is configured to define a mask region on a corresponding portion of the lower level to prevent deposition of the selected material on the corresponding portions of the lower level that are masked by the upper level overhang. The electrically conductive traces are selectively isolated from one another by one or more of the mask region and the undercut, and the undercut is configured to selectively define the mask region directly below the upper level overhang to prevent deposition of the selected material on the corresponding portion of the lower level while allowing deposition of the selected material on upper level regions and on lower level regions that are not masked by the upper level overhang.

In accordance with certain exemplary implementations of the disclosed technology, the selected material utilized for fabricating the three-dimensional (3D) electronic circuit can include one or more of an adhesion material, an electrically conductive material, a semiconductor material, an electrical insulator material, a thermally conductive material, and a thermally non-conductive material. In certain implementations the selected material comprises one or more of metal and metal alloys.

In certain implementations, one or more of the upper level and the lower level of the 3D electronic circuit may be characterized by one of more of a planar surface, a slope, and a curvature, and wherein the undercut is characterized by one or more of sloped steps, reverse curvatures, 90° angle steps, and combination of sloped steps and a 90° angle step.

In accordance with certain exemplary implementations of the disclosed technology, one or more undercuts of 3D electronic circuit may be configured cause at least a portion of the 3D electronic circuit to compressible to create a spring force.

In certain exemplary implementations, the electrically conductive traces are thermally and mechanically treated to bind with one or more of external metal wires, C4 microbumps of a chip, pins, and metal leads.

In accordance with certain exemplary implementations of the disclosed technology, a 3D superstrate structure may be formed or stacked on one or more of a top, a bottom, and a side of the 3D structure, wherein the 3D superstrate structure and the 3D structure may be electrically connected.

As may be readily apparent to those having skill in the art, the methods disclosed here may enable metallization and microfabrication techniques that are compatible with 3D printing, and that enable the simultaneous microfabrication of multiple electrical connections. Such techniques disclosed herein may be utilized in a wide variety of applications, including but not limited to the 3D construction of Micro-Electromechanical Systems (MEMS), micro-antennas, etc.

The 3D printing and deposition methods disclosed herein demonstrate a beneficial fabrication technology that virtually exhibits no limitations as to what can be printed. Conventional microfabrication technology, on the other hand, is heavily bounded and influenced by standardized processes such as CMOS, hence optimized for fabricating 2D layouts rather than 3D structures. Thus, the disclosed invention is an enabling technology that can pave the way to utilize 3D printing for electronic applications and can address pitch, height, and geometry limitations imposed by conventional 2D microfabrication technologies.

Moreover, the techniques disclosed herein may be used to construct nearly any 3D structure, thus providing viable microfabrication techniques for building 3D microdevices (e.g., 3D antennas). Enabled by the techniques disclosed herein and employing 3D printing, it is feasible to tailor the shapes, height, and pitch of the devices with improved electrical and mechanical properties.

In certain implementations disclosed herein, a polymer may be utilized to 3D print a structure that is electrically non-conductive. A subsequent metallization process is may be utilized to create electrical connections. Unlike conventional microfabrication methods that employ a subsequent patterning step (i.e., photoresist coating, lithography, and development) to form metal traces and connections, the technology disclosed herein does not require any additional patterning for defining electrical paths. This lithography-free approach enables production of additively manufactured microdevices that can be designed with special shapes.

The combination of high-resolution 3D printing of polymers and the lithography-free metallization process disclosed herein is an enabling technology for making 3D-antennas, and other microdevices. The disclosed technology provides manufacturing flexibilities that address the fundamental limitations for building 3D devices due to shortcomings with conventional microfabrication technologies.

Certain example implementation of the disclosed technology may provide the technical effects and/or benefits of enabling the formation of circuitry on complex-shaped 3D structures. The disclosed technology removes certain geometrical limitations and provides a number of advantages over traditional planar circuit processing techniques, including but not limited to reducing one or more processing steps. The disclosed technology enables simultaneous formation and electrical isolation of regions in which materials are directionally deposited on the 3D structure using deposition techniques. In this respect, certain steps in traditional circuit board processing can be avoided, such as spinning photoresist on a copper coated substrate, exposing the photoresist to light, etching the copper, etc.

Numerous characteristics and advantages have been set forth in the foregoing description, together with details of structure and function. While the disclosed technology has been presented in several forms herein, it may be apparent to those skilled in the art that many modifications, additions, and deletions, especially in matters of shape, size, and arrangement of parts, can be made therein without departing from the spirit and scope of the disclosure and its equivalents as set forth in the following claims. Therefore, other modifications or embodiments as may be suggested by the teachings herein are particularly reserved as they fall within the breadth and scope of the claims.

I claim:

1. A method of additively manufacturing an electronic device structure, the method comprising:
additively forming and photocuring a 3D structure, the 3D structure characterized by:
an upper level;
a lower level; and
a pedestal portion joining the upper level and the lower level, the pedestal portion comprising an undercut, wherein the undercut defines an upper level overhang configured to define a mask region over a portion of the lower level; and
forming at least two electrically isolated planes of electronic circuitry by directionally depositing a selected material on the upper level and one or more non-masked portions of the lower level, wherein the one or more non-masked portions of the lower level are not masked by the upper level overhang, wherein the upper level overhang is configured to prevent deposition of the selected material on the portion of the lower level that is masked by the upper level overhang.

2. The method of claim 1, wherein the undercut is configured to selectively define the mask region directly below the upper level overhang to prevent deposition of the selected material on the portion of the lower level that is masked by the upper level overhang while allowing deposition of the selected material on upper level regions and on lower level regions that are not masked by the upper level overhang.

3. The method of claim 1, wherein directionally depositing the selected material comprises one or more of sputtering, thermal evaporation, spray coating, and aerosol jet printing, and wherein an angle of deposition is selected from a range of 0 degrees to 90 degrees with respect to a top surface of the 3D structure.

4. The method of claim 3, wherein the selected material comprises one or more of an adhesion material, an electrically conductive material, a semiconductor material, an electrical insulator material, a thermally conductive material, and a thermally non-conductive material.

5. The method of claim 3, wherein the selected material comprises one or more of metal and metal alloys.

6. The method of claim 3, further comprising reducing a thickness of the deposited selected material by one or more of vapor etching, chemical etching, chemical-mechanical-polishing, and reactive-ion-etching.

7. The method of claim 1, wherein one or more of the upper level and the lower level are characterized by one of more of a planar surface, a slope, and a curvature.

8. The method of claim 1, wherein forming the 3D structure comprises utilizing one or more of photodefinable polymeric material photocuring, photodefinable non-polymeric material photocuring, and mixture of photodefinable polymeric material and non-polymeric material.

9. The method of claim 1, wherein the undercut is characterized by one or more of sloped steps, reverse curvatures, 90° angle steps, and combination of sloped steps and a 90° angle step.

10. The method of claim 1, wherein the selected material is deposited on one or more of a top surface, a bottom surface, a slope, a flat surface, and a curvature of the 3D structure.

11. The method of claim 1, wherein the 3D structure and the undercut are further configured to be compressible to create a spring force.

12. The method of claim 1, wherein directionally depositing the selected material comprises depositing an electrically conductive material on at least the upper level and the one or more non-masked portions of the lower level to form at least two electrically conductive traces that are electrically isolated from one another by at least masked portions of the lower level masked by the upper level overhang.

13. The method of claim 12, further comprising one or more of annealing, thermally treating, and mechanically treating at least one of the electrically conductive traces to enhance thermal and mechanical properties and to enhance binding with one or more of external metal wires, C4 micro-bumps of a chip, pins, and metal leads.

14. The method of claim 1, further comprising forming or stacking a 3D superstrate structure on one or more of a top, a bottom, and a side of the 3D structure using one or more of additive manufacturing, 3D printing, and heterogenous assembly.

15. The method of claim 14 wherein the 3D superstrate structure and the 3D structure are electrically connected.

16. The method of claim 1, further comprising increasing a thickness of the deposited selected material by one or more of electroless-plating, electro-plating, and chemical vapor deposition.

* * * * *